United States Patent
Zhou (10) Patent No.: US 11,719,731 B2
(45) Date of Patent: Aug. 8, 2023

(54) METHOD, APPARATUS AND SYSTEM FOR MEASURING RESISTANCE PARAMETER OF GROUNDING SYSTEM, AND MONITORING NETWORK

(71) Applicant: KINGMORE UNION (BEIJING) SCIENCE & TECHNOLOGY DEVELOPMENT CO., LTD., Beijing (CN)

(72) Inventor: Kaimao Zhou, Beijing (CN)

(73) Assignee: KINGMORE UNION (BEIJING) SCIENCE & TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/625,341

(22) PCT Filed: Jun. 24, 2020

(86) PCT No.: PCT/CN2020/098024
§ 371 (c)(1),
(2) Date: Jan. 7, 2022

(87) PCT Pub. No.: WO2021/004282
PCT Pub. Date: Jan. 14, 2021

(65) Prior Publication Data
US 2022/0260621 A1 Aug. 18, 2022

(30) Foreign Application Priority Data

Jul. 8, 2019 (CN) .......................... 201910611572.6

(51) Int. Cl.
*G01R 27/08* (2006.01)
*G01R 27/20* (2006.01)

(52) U.S. Cl.
CPC .................................. *G01R 27/20* (2013.01)

(58) Field of Classification Search
CPC ...... G01R 27/20; G01R 27/205; G01R 31/50; G01R 31/083; G01R 31/086
See application file for complete search history.

(56) References Cited

U.S. PATENT DOCUMENTS

| 9,239,352 B2 * | 1/2016 | Laepple ................. G01R 27/20 |
| 2008/0265897 A1 * | 10/2008 | Lee ........................ G01R 27/20 324/357 |

(Continued)

FOREIGN PATENT DOCUMENTS

| CN | 104020356 A | 9/2014 |
| CN | 105954594 A | 9/2016 |

(Continued)

*Primary Examiner* — Thang X Le
(74) *Attorney, Agent, or Firm* — Gang Yu (57) ABSTRACT

Provided are a method, apparatus and system for measuring a resistance parameter of a grounding system, and a monitoring network. The method comprises: inputting a driving current into a plurality of sections of a grounding system path (S602), wherein the grounding system path comprises at least a grounded apparatus, a grounding body, and a downlead connecting the grounded apparatus and the grounding body; measuring response voltages generated by the plurality of sections, and acquiring a response current flowing through the downlead (S604); and determining a resistance parameter of the grounding system path according to the driving current, the response voltages and the response current (S606).

17 Claims, 4 Drawing Sheets

(56) References Cited

U.S. PATENT DOCUMENTS

2014/0247063 A1\* 9/2014 Kawasaki .............. G01R 27/20
    324/691
2017/0315251 A1\* 11/2017 Fink ......................... G01V 3/02
2019/0162872 A1\* 5/2019 Morrison ................. G01V 3/38

FOREIGN PATENT DOCUMENTS

| CN | 106841815 A | 6/2017 |
| CN | 107271789 A | 10/2017 |
| CN | 109580722 A | 4/2019 |
| CN | 110261680 A | 9/2019 |
| CN | 210465544 U | 5/2020 |
| JP | 2014153324 A | 8/2014 |

\* cited by examiner

METHOD, APPARATUS AND SYSTEM FOR MEASURING RESISTANCE PARAMETER OF GROUNDING SYSTEM, AND MONITORING NETWORK

CROSS-REFERENCE TO RELATED APPLICATION

This disclosure claims priority to Chinese patent application No. 201910611572.6, filed to the China National Intellectual Property Administration on Jul. 8, 2019 and entitled "Method, Apparatus and System for Measuring Resistance Parameter of Grounding System, and Monitoring Network", the disclosure of which is hereby incorporated by reference in its entirety.

TECHNICAL FIELD

Embodiments of this disclosure relate the technical field of electrical safety measurement, and specifically, to a method, apparatus and system for measuring a resistance parameter of a grounding system, and a monitoring network.

BACKGROUND

At present grounding is a safety connection between some important apparatuses and the ground, and the most fundamental safety protection measures when an electrical power failure occurs in the related apparatus. Oil tanks, transformers, transmission towers, buildings and the like require reliable grounding, and the reliability of the grounding system is required to be checked regularly. for example, in Oil depots, in order to guarantee the reliability of the lightning protection and anti-static grounding system of the oil tank and avoid fire and other events caused by the unable discharging of lightning current or static electricity, measurement is required to be performed on related resistance parameters of the oil tank grounding system. If the measured related resistance parameters are within a qualified range specified by the standard, it is considered that the grounding system is reliable; otherwise, the grounding system may be loose, broken, rusted, poorly grounded and other faults, so that the grounding system needs to be overhauled.

Figure 1:
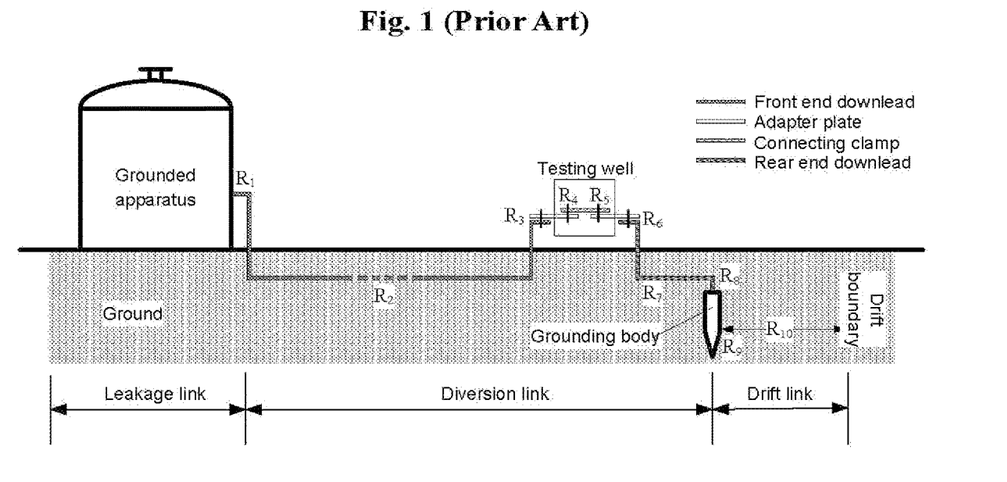
FIG. 1 is a schematic diagram of a typical grounding system by using the grounding of an oil tank as the example.

If the grounding of the oil tank is used as an example, a typical grounding system is shown in FIG. 1. FIG. 1 is a schematic diagram of the typical grounding system by using the grounding of the oil tank as the example. The oil tank is led to the ground via a front end downlead, a left adapter plate, a connecting clamp, a right adapter plate, a rear end downlead and a grounding body. Therefore, a total resistance of the oil tank grounding system path is $R_{total} = R_1 + R_2 + \ldots + R_{10}$, where $R_1$ represents a contact resistance between the oil tank and the front end downlead, $R_2$ represents a welding resistance inside the front end downlead, $R_3$ and $R_6$ represent contact resistances between the downleads and the adapter plates, $R_4$ and $R_5$ represent contact resistances between the adapter plates and the connecting clamp, $R_7$ represents a welding resistance inside the rear end downlead, $R_8$ represents a welding resistance between the rear end downlead and the grounding body, $R_9$ represents a contact resistance between the grounding body and the soil, and $R_{10}$ represents a drift resistance of the soil. Since the grounding body and the downleads are good conductors and have very small bulk resistances, $R_{total}$ does not include these bulk resistances. In the total resistance $R_{total}$ of the grounding system path, $R_1 + R_2 + \ldots + R_8$ is a downlead resistance, and $R_9 + R_{10}$ is a resistance to ground of the grounding body.

During actual measurement, limited by the measurement technologies and instrument functions, and for ease of measurement work, in most cases, it is based on experience that the internal welding of the downlead and the bridging of each portion from the oil tank to a testing well are sufficient and good, that is, it is considered that $R_1 + R_2 + \ldots + R_5 = 0$. Under this assumption, the connecting clamp is opened at the testing well. Alternatively, according to a selective electrode method, the rear end downlead is supplemented with a current detection clamp, to measure a resistance to ground portion (that is, a local path resistance from the testing well to the ground via the rear end downlead and the grounding body $R_{well} = R_6 + R_7 + \ldots + R_{10}$) of the testing well in the grounding system shown in FIG. 1. If a measured result of the resistance to ground of the testing well is less than 10Ω or 100Ω, it is considered that the grounding system is qualified and reliable for lightning protection or electrostatic prevention. Obviously, the measurement method in the related art merely measures the local portion of the grounding system. The measured result does not completely reflect the resistance $R_{total}$ of the grounding system path. As a result, the fault in the grounding system path at a section from the oil tank and the testing well in FIG. 1 cannot be measured.

In addition to the above measurement method, in most cases, a loop resistance value of a loop formed by the front end down lead, the rear end downlead and the ground soil is measured by using clamp loop resistance monitor on the downlead near the testing well, so as to generally reflect the reliability of the grounding system path. However, since the loop resistance value obtained by the measurement method still does not represent the resistance ($R_{total}$) of the grounding system path that really needs to be concerned from a safety perspective, the failure of the grounding system path is still be missed or falsely measured.

In view of the foregoing technical problem of easy missed measurement and wrong measurement of fault in the grounding system due to only local measurement performed on the grounding system in the related art, no effective solution has been proposed yet.

SUMMARY

Embodiments of this disclosure provide a method, apparatus and system for measuring a resistance parameter of a grounding system, and a monitoring network, to at least resolve the technical problem of easy missed measurement and wrong measurement of fault in the grounding system due to only local measurement performed on the grounding system in the related art.

According to an aspect in an embodiment of the present disclosure, a method for measuring a resistance parameter of a grounding system is provided, including: inputting a driving current into a plurality of sections of a grounding system path, where the grounding system path includes at least a grounded apparatus, a grounding body, and a downlead connecting the grounded apparatus and the grounding body; measuring response voltages generated by the plurality of sections, and acquiring a response current flowing through the downlead; and determining a resistance parameter of the grounding system path according to the driving current, the response voltages and the response current.

According to another aspect in an embodiment of the present disclosure, a system for measuring a resistance parameter of a grounding system is further provided, including: a plurality of driving electrodes, connected to a current output end of a monitor, disposed at a plurality of sections of a grounding system path, and configured to input a driving current into the plurality of sections, where the grounding system path includes at least a grounded apparatus, a grounding body, and a downlead connecting the grounded apparatus and the grounding body; a plurality of sensing electrodes, connected to a voltage input end of the monitor, wherein the plurality of sensing electrodes and the plurality of driving electrodes are disposed at the plurality of sections in pairs, and the sensing electrodes are configured to measure response voltages generated by the plurality of sections; a current sensing apparatus, connected to a current acquisition input end of the monitor, sleeved on the downlead, and configured to sense a response current flowing through the downlead; and the monitor, configured to determine a resistance parameter of the grounding system path according to the driving current, the response voltages and the response current.

According to another aspect in an embodiment of the present disclosure, an apparatus for measuring a resistance parameter of a grounding system is further provided, including: an output module, configured to output a driving current to a plurality of sections of a grounding system path, where the grounding system path includes at least a grounded apparatus, a grounding body, and a downlead connecting the grounded apparatus and the grounding body; a measurement module, configured to measure response voltages generated by the plurality of sections, and acquire a response current flowing through the downlead; and a master control module, configured to determine a resistance parameter of the grounding system path according to the driving current, the response voltages and the response current.

According to another aspect in an embodiment of the present disclosure, a non-volatile storage medium is further provided. The non-volatile storage medium includes a stored program. The program controls a device where the non-volatile storage medium is located to perform the above method for measuring a resistance parameter of a grounding system when being operated by a processor.

According to another aspect in an embodiment of the present disclosure, a monitoring network host is further provided, including: at least one above system for measuring a resistance parameter of a grounding system; and a monitoring network host, connected to a monitor in a wired communication or wireless communication manner, configured to send a set parameter and a monitoring instruction to the monitor, and receiving a resistance parameter from the monitor.

In the above embodiments of the present disclosure, a driving current is inputted into a plurality of sections of a grounding system path. The grounding system path includes at least a grounded apparatus, a grounding body, and a downlead connecting the grounded apparatus and the grounding body. Response voltages generated by the plurality of sections are measured, and a response current flowing through the downlead is acquired. A resistance parameter of the grounding system path is determined according to the driving current, the response voltages and the response current. Through the above solution, the driving current is applied to the plurality of sections, to measure the corresponding response voltages and the response current. Based on a circuit principle such as an Ohm law and a Kirchhoff law, an association relationship of the above parameters is established. Therefore, a purpose of accurately acquiring the grounding resistance of the grounded apparatus, the resistance parameters of the grounding system path and overall reliability information is achieved. In this way, the technical problem of easy missed measurement and wrong measurement of fault in the grounding system due to only local measurement performed on the grounding system in the related art is resolved.

BRIEF DESCRIPTION OF THE DRAWINGS

The accompanying drawings described herein are used to provide a further understanding of this disclosure, and constitute a part of this disclosure. The exemplary embodiments of this disclosure and the description thereof are used to explain this disclosure, but do not constitute improper limitations to this disclosure. In the drawings.

DETAILED DESCRIPTION OF THE EMBODIMENTS

In order to enable those skilled in the art to better understand the solutions of this disclosure, the technical solutions in the embodiments of this disclosure will be clearly and completely described below in combination with the drawings in the embodiments of this disclosure. It is apparent that the described embodiments are only part of the embodiments of this disclosure, not all the embodiments. All other embodiments obtained by those of ordinary skill in the art on the basis of the embodiments in this disclosure without creative work shall fall within the scope of protection of this disclosure.

It is to be noted that terms "first", "second" and the like in the description, claims and the above mentioned drawings of this disclosure are used for distinguishing similar objects rather than describing a specific sequence or a precedence order. It should be understood that the object described in such a way may be exchanged where appropriate, in order that the embodiments of this disclosure described here can be implemented in an order other than those illustrated or described herein. In addition, terms "include" and "have" and any variations thereof are intended to cover non-exclusive inclusions. For example, it is not limited for processes, methods, systems, products or devices containing a series of steps or units to clearly list those steps or units, and other steps or units which are not clearly listed or are inherent to these processes, methods, products or devices may be included instead.

Figure 2:
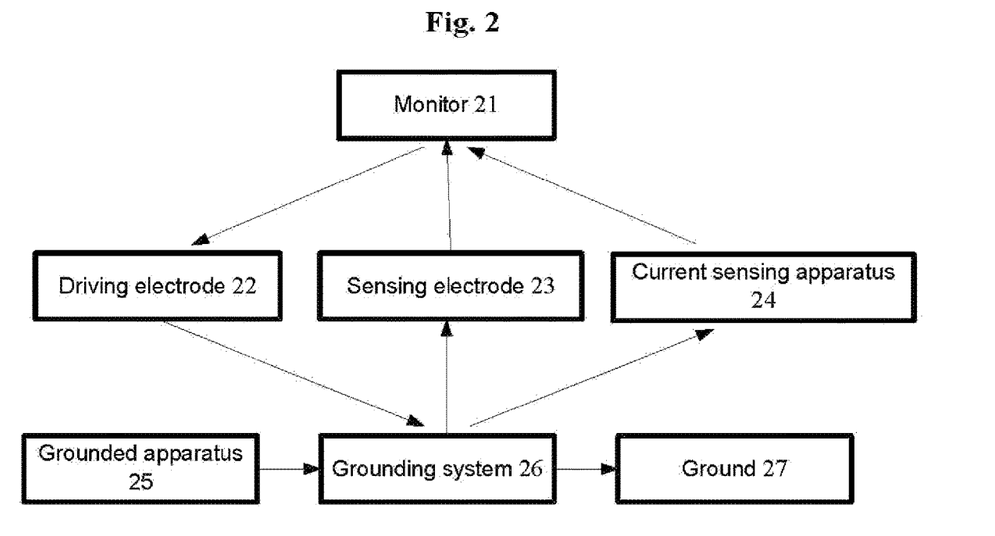
FIG. 2 is a schematic diagram of an optional system for measuring a resistance parameter of a grounding system according to an embodiment of the present disclosure.

Before details of the embodiments of this disclosure is further described, an optional system for measuring a resistance parameter of a grounding system applicable to implement a principle of this disclosure is will be described with reference to FIG. 2. In a most basic configuration, FIG. 2 is a schematic diagram of an optional system for measuring a resistance parameter of a grounding system according to an embodiment of this disclosure. For a descriptive purpose, the illustrative architecture is merely an example of a suitable environment, and does not impose any limitation on the system structure, scope of use, or function of this disclosure, nor should the measurement system be interpreted as having any dependency or requirement on any component or combination shown in FIG. 2.

As shown in FIG. 2, the system for measuring a resistance parameter of a grounding system provided in this embodiment includes a monitor 21, a driving electrode 22, a sensing electrode 23, a current sensing apparatus 24, a grounded apparatus 25, a grounding system 26 and the ground 27.

A plurality of driving electrodes are connected to a current output end of a monitor, disposed at a plurality of sections of a grounding system path, and configured to input a driving current into the plurality of sections. The grounding system path includes at least a grounded apparatus, a grounding body, and a downlead connecting the grounded apparatus and the grounding body.

In an optional solution, the above driving electrodes may be metal conductors, for example, cold pressed connecting terminals made of brass or red copper. The grounding system path is particularly designed for safety grounding, is from the grounded apparatus to the ground, and may include the grounded apparatus, the downlead and the grounding body. The whole grounding path other than the foregoing grounding system path of the grounded apparatus may further include a path via supporting portion such as a base, a supporting frame and a foot frame from the grounded apparatus and an external connection accessory such as an interconnection pipe, a line and a bridge between the grounded apparatus and other apparatuses or facilities to the ground. The grounded apparatus may be an oil tank, a transformer, a transmission tower, a building, an electrical device, or the like.

In an embodiment, the monitor may have a plurality of input ports/output ports. The plurality of driving electrodes are connected to the plurality of output ports of the monitor one by one. The monitor may apply a driving current of which current is known to any section of the grounding system path by using the driving electrodes. The magnitude and direction of the driving current are controllable. For example, for safety, the magnitude of the driving current may select a weak driving current that meets an intrinsic safety standard.

It is to be noted that, the underground driving electrodes may also be rod metal bodies having anti-rust functions. One ends of the metal bodies may be in conical shapes, so that the metal bodies are easily inserted into the ground, and the service life of the electrodes is prevented from being affected by soil corrosion. In addition, since a grounding network is a "large" grounding body, the grounding body in this disclosure may include the grounding network.

A plurality of sensing electrodes are connected to a voltage input end of the monitor. The plurality of sensing electrodes and the plurality of driving electrodes are disposed at the plurality of sections in pairs, and the sensing electrodes are configured to measure response voltages generated by the plurality of sections.

In an optional solution, the above sensing electrodes may also be the metal conductors, for example, cold pressed connecting terminals made of brass or red copper. Likewise, the underground sensing electrodes may also be the rod metal bodies having anti-rust functions. One ends of the metal bodies may be in conical shapes.

In an embodiment, the plurality of sensing electrodes and the plurality of input ports are connected one by one. The driving electrodes and the sensing electrodes are disposed in pairs at the plurality of sections of the grounding system path and under the ground at a certain distance from the grounding body in a direction away from the grounded apparatus. In this way, if the monitor applies the driving current of which current is known to some section of the grounding system path by using the driving electrodes, the response voltage at the section can be measured by the sensing electrodes.

It is to be noted that, since the driving electrodes are configured to apply the current to the grounding system path, and the sensing electrodes are configured to measure the voltage of the section applied with the current, the driving electrodes and the sensing electrodes mounted on the grounding system path are mounted as close as possible, but cannot be in direct contact with each other. However, for the driving electrodes and the sensing electrodes mounted under the ground, in order to avoid the impact of a drift electric field on the measured result, a distance between the driving electrodes and the grounding body needs to be guaranteed that the drift electric fields of the driving electrodes and the grounding body cannot be overlapped. In addition, the sensing electrodes are located in the middle portion of the driving electrodes and the grounding body and are located outside the drift electric fields of the grounding body and the driving electrodes.

The current sensing apparatus is connected to a current acquisition input end of the monitor, sleeved on the downlead, and configured to sense a response current flowing through the downlead.

In an optional solution, the current sensing apparatus may be an annular current sensor or a clamp current sensor, which is conveniently sleeved on the downlead of the grounding system path.

In an embodiment, the current sensing apparatus is sleeved on the downlead of the grounding system path, and its output end is connected to the current acquisition input port of the monitor. In this way, if the monitor applies the driving current of which current is known to some section of the grounding system path by using the driving electrodes, the response voltage at the section can be measured by the sensing electrodes, and the response current on the downlead can be measured by the current sensing apparatus.

The monitor is configured to determine a resistance parameter of the grounding system path according to the driving current, the response voltages and the response current.

In an optional solution, the resistance parameter may be a total grounding resistance of the grounded apparatus, a downlead resistance, a resistance to ground of the downlead, a resistance to ground of the grounding body, a total resistance of the grounding system path, or the like. By determining whether the resistance parameter exceeds a standard-specified limiting value, whether there may be loose, broken, rusted, poorly grounded and other faults in the grounding system path can be determined, therefore, the reliability of the grounding system is determined.

Since the measurement of grounding parameters in related art usually adopts manual measurement mode, even if a certain measurement shows that the grounding resistance meets the requirements, as time goes by, the grounding system is completely and likely to have local corrosion fractures, loose overlap joints and oxidation and rust on the contact surface before the next measurement, resulting in missed measurement of the grounding system, so that even qualified measured results cannot guarantee the long-term reliability of the grounding system. Actually, the oxidation corrosion of the contact surface of the overlap joints of the downlead is certain to occur between two measurements. If lightning strike occurs under this case, grounding protection inevitably loses its effectiveness to cause accidents.

Considering the above factors, a connection relationship among the plurality of driving electrodes, the plurality of sensing electrodes, the current sensing apparatus, the monitor and the grounded apparatus may be ready to use and mount, and may also be long-time fixed mounting. When the manner of long-time fixed mounting is used, the grounding system of the grounded apparatus may be monitored on line in real time or automatically and periodically monitored.

In an optional embodiment, real-time monitoring is required to be performed on the grounding system of the oil tank. A grounding system path from the oil tank to the ground includes a downlead, a testing well, a grounding body, and other components. The driving electrodes and the sensing electrodes are disposed in pairs at different sections of the grounding system path and at predetermined positions of the ground. A current output end of the monitor is connected to the driving electrodes. A voltage input end is connected to the sensing electrodes. The current acquisition input end is connected to the current sensing apparatus. The monitor successively applies a weak driving current that meets an intrinsic safety standard to the plurality of sections of the grounding system path. Then, the response voltages generated by the corresponding sections are measured by using the sensing electrodes. The response current on the downlead is measured by using the current sensing apparatus. According to circuit principles such as an Ohm law and a Kirchhoff law, an association relationship of the above parameters is established. Related resistance parameters of a to-be-measured grounding system path are obtained by solving the association relationship. Based on this, whether the grounding system of the oil tank is qualified and reliable is determined. For example, whether the grounding system is corroded, loosened and broken can be determined by determining whether a related resistance value of the grounding system path exceeds a specified limiting value.

In an embodiment of this disclosure, a system for measuring a resistance parameter of a grounding system includes: a plurality of driving electrodes, connected to a current output end of a monitor, disposed at a plurality of sections of a grounding system path, and configured to input a driving current into the plurality of sections, where the grounding system path includes at least a grounded apparatus, a grounding body, and a downlead connecting the grounded apparatus and the grounding body; a plurality of sensing electrodes, connected to a voltage input end of the monitor, wherein the plurality of sensing electrodes and the plurality of driving electrodes are disposed at the plurality of sections in pairs, and the sensing electrodes are configured to measure response voltages generated by the plurality of sections; a current sensing apparatus, connected to a current acquisition input end of the monitor, sleeved on the downlead, and configured to sense a response current flowing through the downlead; and the monitor, configured to determine a resistance parameter of the grounding system path according to the driving current, the response voltages and the response current. Through the above solution, the driving current is applied to the plurality of sections, to measure the corresponding response voltages and the response current flowing through the downlead. Based on circuit principles such as an Ohm law and a Kirchhoff law, an association relationship of the above parameters is established. Therefore, a purpose of accurately acquiring the related resistance parameter value of the entire to-be-measured grounding system path is achieved. In this way, the technical problem of easy missed measurement and wrong measurement of fault in the grounding system due to only local measurement performed on the grounding system in the related art is resolved.

In an embodiment, under a case that the grounded apparatus has a supporting component and/or an external connection accessory, a grounding path of the grounded apparatus includes three branches. A first branch is the grounding system path via the downlead, the grounding body to the ground, and a branch resistance of the first branch includes a downlead resistance and a resistance to ground of the grounding body. A second branch is a path via the downlead to the ground, for example, the second branch is a path directly to the ground via the downlead, and a branch resistance of the second branch includes the downlead resistance and the resistance to ground of the downlead. A third branch is a path via the supporting component and/or the external connection accessory of the grounded apparatus to the ground, and a branch resistance of the third branch is equivalent to a bypass resistance.

In an optional solution, the supporting component may be a base, a supporting frame, a foot frame, or the like. The external connection accessory may be an interconnection pipe, a line, a bridge, and other functional external connection accessories between the grounded apparatus and other apparatuses or facilities.

Figure 3:
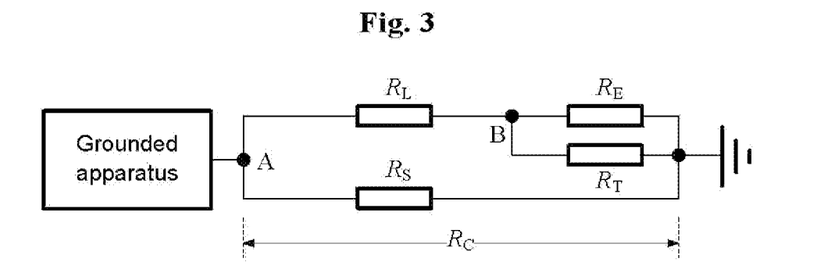
FIG. 3 is an equivalent circuit diagram of a grounding path of an optional grounded apparatus according to an embodiment of the present disclosure.

In this embodiment, if the grounded apparatus has the supporting component and the external connection accessory, in order to guarantee the accuracy of the measured result, the resistance of the section of this portion needs to be considered as well. FIG. 3 is an equivalent circuit diagram of a grounding path of an optional grounded apparatus according to an embodiment of this disclosure. As shown in FIG. 3, the equivalent circuit includes three branches. A first branch is a special grounding system path via the downlead, the grounding body to the ground, and includes a downlead resistance $R_L$ between an A point and a B point and a resistance to ground $R_E$ of the grounding body. A second branch is a path directly to the ground via a buried downlead, and includes the downlead resistance $R_L$ and a resistance to ground $R_T$ of the downlead. A third branch is a path via the supporting component, the external connection accessory to the ground, and includes an equivalent bypass resistance $R_S$ of the path. Optionally, the resistance to ground $R_E$ of the grounding body is a resistance from the internal of the grounding body to the ground. The downlead resistance $R_L$ is a resistance of the downlead between the grounded apparatus and the grounding body, which are mainly expressed as a welding resistance and bonding resistance everywhere on the downlead path. A total grounding resistance $R_C$ of the grounded apparatus is a total ground resistance of the grounded apparatus via all possible paths, such as the downlead, the grounding body, the supporting component and/or the external connection accessory of the grounded apparatus, to the ground.

It is to be noted that, according to the grounded apparatus and different actual situations and conditions of its grounding system, the quantity of the branches of the grounding path and the equivalent circuit thereof may be differ from the quantity of the branches shown in FIG. 3 here and the equivalent circuit, which are not limited herein.

Figure 4:
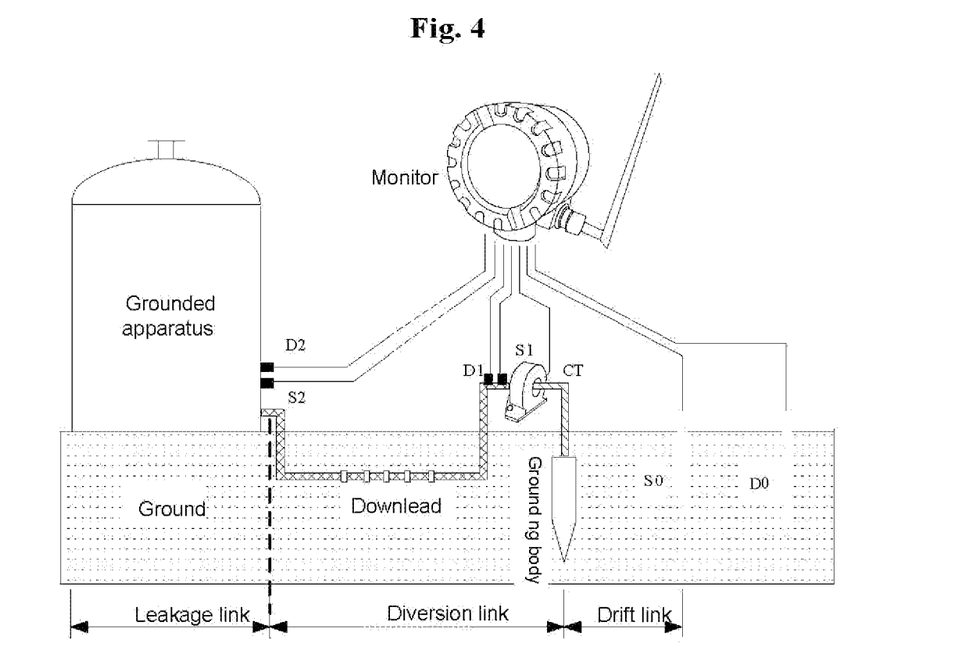
FIG. 4 is a schematic diagram of mounting and connection of an optional system for measuring a resistance parameter of a grounding system according to an embodiment of the present disclosure.

An example that the grounding path includes three branches is used for detail description. FIG. 4 is a schematic diagram of mounting and connection of an optional system for measuring a resistance parameter of a grounding system according to an embodiment of this disclosure. As shown in FIG. 4, the driving electrode includes a first driving electrode D2, a second driving electrode D1 and a third driving electrode D0. The sensing electrode includes a first sensing electrode S2, a second sensing electrode S1 and a third sensing electrode S0. The first driving electrode D2 and the first sensing electrode S2 are disposed at the grounded apparatus. The second driving electrode D1 and the second sensing electrode S1 are disposed a preset distance of the grounding system path from the grounding body. The third sensing electrode S0 and the third driving electrode D0 are disposed under the ground and successively disposed on an extended line of a line segment determined by the grounded apparatus and the grounding body. The third sensing electrode S0 is located outside a drift electric field of the third driving electrode D0 and the grounding body.

In an optional solution, the preset distance may be 0, that is, the second driving electrode D1 and the second sensing electrode S1 are disposed on the grounding body. The preset distance may be a distance of a position point on the downlead close to the grounding body from the grounding body, for example, 5 cm, 3 cm, and the like. The line segment is determined based on a top view angle. Further, viewing downward from the top view angle, a center point of the third driving electrode D0, a center point of the third sensing electrode S0, a center point of the grounding body and a center point of the grounded apparatus are successively located on a same straight line.

In an embodiment, the first driving electrode D2 and the first sensing electrode S2 are mounted at a main conductive portion applicable for grounding, such as a metal framework and a metal housing, of the grounded apparatus. The second driving electrode D1 and the second sensing electrode S1 are mounted on the grounding body or the downlead close to the grounding body. The first driving electrode D2, the first sensing electrode S2, the second driving electrode D1 and the second sensing electrode S1 may be formed by welding conducting wires on brass/red copper cold pressed connecting terminals. The first driving electrode D2 and the first sensing electrode S2 are tightly mounted at the main conductive portion of the grounded apparatus by using bolts/nuts. The second driving electrode D1 and the second sensing electrode S1 are tightly mounted on the grounding body or the downlead close to the grounding body. It is to be noted that, the first driving electrode D2 and the first sensing electrode S2, and the second driving electrode D1 and the second sensing electrode S1 are mounted as close as possible, but cannot be in direct contact with each other.

According to a position mounting condition of the foregoing third driving electrode and the third sensing electrode, for most soil resistivity situations, the third driving electrode D0 may be mounted under the ground away from the grounded apparatus and about 40 m from the grounding body. The third sensing electrode S0 is mounted under the ground at the middle position of the third driving electrode D0 and the grounding body. The third driving electrode D0 and the third sensing electrode S0 may select copper rod electrodes or other metal rod electrodes with galvanized and other surface anti-rust treatment, and are respectively buried under the ground away from the grounded apparatus and about 40 m and 20 m from the grounding body.

Through the above fixed mounting manner, the monitor may completely and accurately monitor resistance values of the grounding system and the reliability of the system. Therefore, tedious operation of manual measurement, incomplete measurement of the grounding system and untimely detection of faults in the grounding system are overcome, and wrong measurement or missed measurement of the faults such as rust and fracture of the grounding system is avoided.

In an embodiment, the first driving electrode D2 and the second driving electrode D1 input a first driving current $I_{D12}$ into a section between the first driving electrode D2 and the second driving electrode D1. The second driving electrode D1 and the third driving electrode D0 input a second driving current $I_{D10}$ into a section between the second driving electrode D1 and the third driving electrode D0. The first driving electrode D2 and the third driving electrode D0 input a third driving current $I_{D20}$ into a section between the first driving electrode D2 and the third driving electrode D0.

In an optional solution, the first driving current, the second driving current and the third driving current may be weak driving currents that meet an intrinsic safety standard and have known magnitudes.

It is to be noted that, since the grounding systems of too many power devices mainly achieve grounding protection for alternating currents, results measured by the related art mostly are alternating current grounding resistances of the grounded apparatus. However, for actual working conditions of lightning protection and electrostatic prevention of the grounding system of the oil tank, the alternating current grounding resistance can neither reflect a direct current grounding resistance during electrostatic discharge, nor reflect an impact earth resistance during lightning discharge. Therefore, there are still some problems with the applicability of the results obtained by a conventional grounding system measurement technology. In addition, a conventional monitor generally generates a high voltage or a large current during measurement. For example, an excitation voltage during measurement is usually as high as forty to fifty volts to one or two hundred volts, and the current may be as high as tens of amperes. In view of a measurement object and site of the grounding system of the oil tank, regardless of the oil in the tank or the high concentration oil and gas that may appear in the reservoir area outside the tank, the appearance of the high voltage or large current is a safety hazard.

Considering the above factors, the driving current in this disclosure may be set according to requirements. Optionally, in addition to a conventional alternating current, a waveform of the driving current may further be a direct current and shock pulse, which can measure a driving current resistance parameter and an impact resistance parameter of the grounding system of the oil tank for the situations of electrostatic discharge and lightning discharge. The driving current may be the weak driving current that meets the intrinsic safety standard, so that the high voltage or large current cannot be generated during measurement. Therefore, good safety performance is achieved.

Still by taking FIG. 4 as an example, if the driving current is applied, the first sensing electrode S2 and the second sensing electrode S1 measure a first response voltage $V_{S12}$ of a section between the first sensing electrode S2 and the second sensing electrode S1. The current sensing apparatus CT senses a first response current $I_{L12}$ flowing through the downlead. The second sensing electrode S1 and the third sensing electrode S0 measure a second response voltage $V_{S10}$ of a section between the second sensing electrode S1 and the third sensing electrode S0. The current sensing apparatus CT senses a second response current $I_{L10}$ flowing through the downlead. The first sensing electrode S2 and the third sensing electrode S0 measure a third response voltage $V_{S20}$ of a section between the first sensing electrode S2 and the third sensing electrode S0. The current sensing apparatus CT senses a third response current $I_{L20}$ flowing through the downlead.

In an embodiment, the current sensing apparatus CT is sleeved on the downlead between the second driving electrode D1/the second sensing electrode S1 and the grounding body. Alternatively, the current sensing apparatus CT is sleeved on the downlead between the grounded apparatus and the second driving electrode D1/the second sensing electrode S1.

Figure 5:
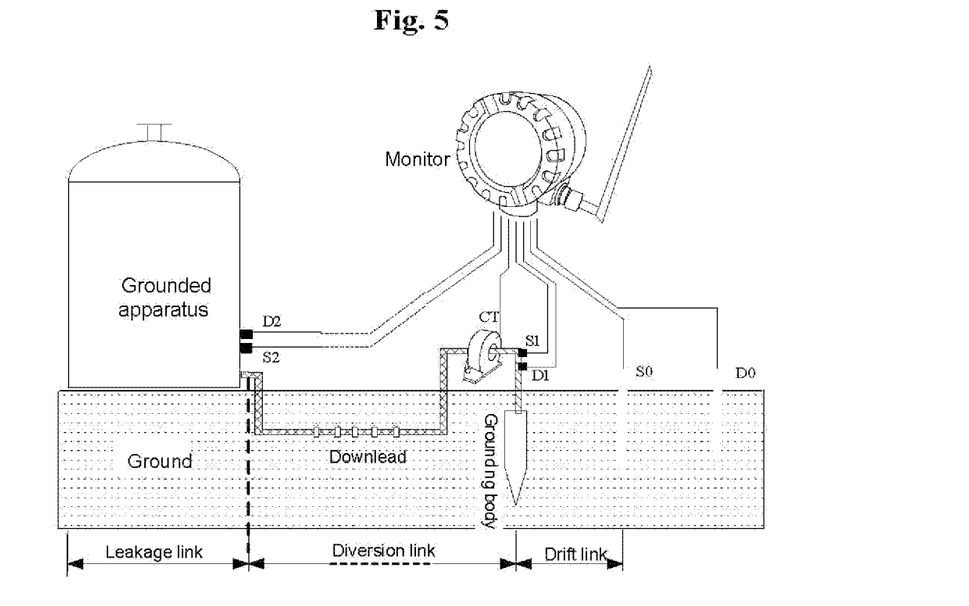
FIG. 5 is a schematic diagram of mounting and connection of another optional system for measuring a resistance parameter of a grounding system according to an embodiment of the present disclosure.

It is to be noted that, the current sensing apparatus CT is externally sleeved on the downlead close to the grounded apparatus end or close to the grounding body end, and is configured to measure the response current flowing through the downlead. If the current sensing apparatus is externally sleeved on the downlead close to the grounding body end, the current sensing apparatus may be located between the second driving electrode D1/the second sensing electrode S1 and the grounding body, as shown in FIG. 4. The current sensing apparatus may further be located between the second driving electrode D1/the second sensing electrode S1 and an oil tank, as shown in FIG. 5. FIG. 5 is a schematic diagram of mounting and connection of another optional system for measuring a resistance parameter of a grounding system according to an embodiment of this disclosure.

In an embodiment, the monitor determines resistance parameters of a to-be-measured grounding system path according to the driving current, the response voltage and the response current. The method includes: acquiring a first relationship model among the first driving current $I_{D12}$, the first response voltage $V_{S12}$ and the first response current $I_{L12}$ based on circuit principles such as the Ohm law and the Kirchhoff law; acquiring a second relationship model among the second driving current $I_{D10}$, the second response voltage $V_{S10}$ and the second response current $I_{L10}$ based on circuit principles such as the Ohm law and the Kirchhoff law; acquiring a third relationship model among the third driving current $I_{D20}$, the third response voltage $V_{S20}$ and the third response current $I_{L20}$ based on circuit principles such as the Ohm law and the Kirchhoff law; and determining the resistance parameters of the to-be-measured grounding system path according to the first relationship model, the second relationship model and the third relationship model.

Referring to FIG. 3 and FIG. 4, according to a series-parallel relationship of each grounding branch resistance of the grounded apparatus, and through the utilization of the Ohm law, the Kirchhoff voltage law and the Kirchhoff current law, the following equation set is listed:

$$\begin{cases} V_{S10} = I_{L10} \cdot R_E \\ I_{D10} = I_{L10} + \dfrac{V_{S10}}{R_T} + \dfrac{V_{S10}}{R_L + R_S} \\ V_{S20} = I_{L20} \cdot R_E + \left(I_{L20} + \dfrac{I_{L20} \cdot R_E}{R_T}\right) \cdot R_L \\ I_{D20} = \dfrac{V_{S20}}{R_C} = \dfrac{V_{S20}}{R_S} + \dfrac{V_{S20}}{R_L + R_E \| R_T} \\ V_{S12} = I_{L12} \cdot R_E + \left(I_{L12} + \dfrac{I_{L12} \cdot R_E}{R_T}\right) \cdot R_S \\ I_{D12} = \dfrac{V_{S12}}{R_L} + I_{L12} + \dfrac{I_{L12} \cdot R_E}{R_T} \end{cases}$$

By solving the above equation set, key resistance parameters of the grounding system path, such as the total grounding resistance $R_C$ of the grounded apparatus, the downlead resistance $R_L$ and the resistance to ground $R_E$ of the grounding body, can be obtained. As shown in FIG. 5, if the current sensing apparatus is externally sleeved on the downlead of the grounded apparatus side tightly close to the second driving electrode D1 and the second sensing electrode S1, or externally sleeved on the downlead tightly close to the grounded apparatus end, a solving process is similar to the above method, and is not described herein again.

In an embodiment, the monitor further includes a wired communication module and/or a wireless communication module.

In an optional solution, the wired communication module may be an RS-485 communication module. The wireless communication module may be a wireless module including an antenna. The monitor may transmit information, such as resistance parameters related to the grounding system path obtained through measurement, to a monitoring network host in real time by using the communication module, and receive a set parameter and a monitoring instruction of the monitoring network host.

In an embodiment, the monitor may further include a display module and a local control module.

After the resistance parameters of the grounding system, such as the total grounding resistance $R_C$ of the grounded apparatus, the downlead resistance $R_L$ and the resistance to ground $R_E$ of the grounding body, are solved, whether the grounding system is qualified or is corroded, loosened and broken may be determined according to whether the resistance parameters of the grounding system exceed the standard-specified limiting value. Related information is transmitted to the monitoring network host. The corresponding resistance value and an ultra-limit state thereof are displayed on a display screen of the monitor. Related resistance parameters and reliability of the to-be-measured grounding system path are acquired in real time for a long time. Therefore, reference and basis can be provided for the maintenance, overhauling and other works of the grounding system.

Under a system for measuring the reliability of a grounding system provided in Embodiment 1, this embodiment provides a method for measuring the reliability of a grounding system. It is to be noted that the steps shown in the flow diagram of the accompanying drawings may be executed in a computer system, such as a set of computer-executable instructions, and although a logical sequence is shown in the flow diagram, in some cases, the steps shown or described may be executed in a different order than here.

Figure 6:
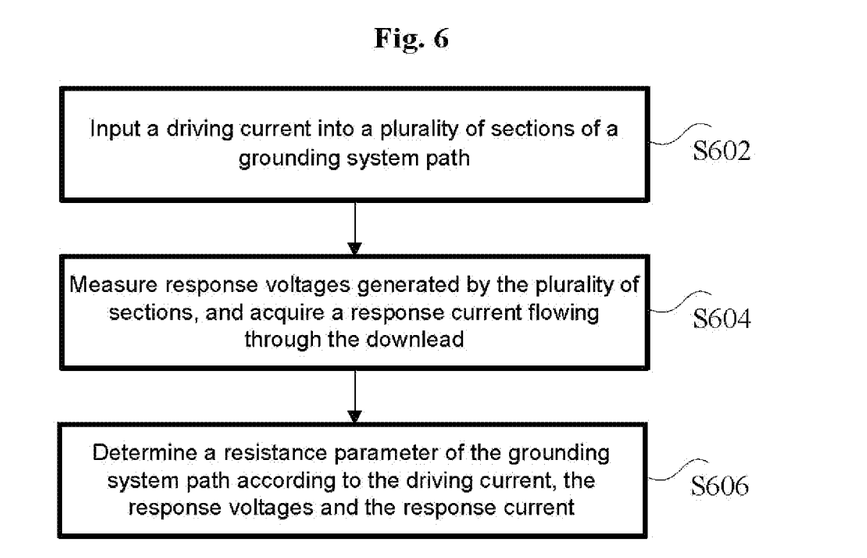
FIG. 6 is a flowchart of an optional method for measuring a resistance parameter of a grounding system according to an embodiment of the present disclosure.

FIG. 6 is a flowchart of an optional method for measuring a resistance parameter of a grounding system according to an embodiment of this disclosure. As shown in FIG. 6, a method includes the following steps:

At step S602, a driving current is inputted into a plurality of sections of a grounding system path.

The grounding system path includes at least a grounded apparatus, a grounding body, and a downlead connecting the grounded apparatus and the grounding body.

The grounding system path is particularly designed for safety grounding, is from the grounded apparatus to the ground, and may include the grounded apparatus, the downlead and the grounding body. The whole grounding path other than the foregoing grounding system path of the grounded apparatus may further include a path via supporting portion such as a base, a supporting frame and a foot frame of the grounded apparatus and/or an functional external connection accessory such as an interconnection pipe, a line and a bridge between the grounded apparatus and other apparatuses or facilities to the ground. The grounded apparatus may be an oil tank, a transformer, a transmission tower, a building, an electrical device, or the like.

It is to be noted that, since a grounding network is a "large" grounding body, the grounding body may include the grounding network.

At step S604, response voltages generated by the plurality of sections are measured, and a response current flowing through the downlead is sensed.

In an optional solution, an apparatus configured to sense the current of the downlead may be an annular current sensor or a clamp current sensor, which is conveniently sleeved on the downlead of the grounding system path.

Optionally, the current sensing apparatus is sleeved on the downlead of the grounding system path, and its output end is connected to the current acquisition input port of the monitor. In this way, if the driving current of which current is known is applied to some section of the grounding system path, the response voltage at the section can be measured, and the response current on the downlead can be measured by the current sensing apparatus.

At step S606, a resistance parameter of the grounding system path is determined according to the driving current, the response voltages and the response current.

In an optional solution, the resistance parameter may be a total grounding resistance of the grounded apparatus, a downlead resistance, a resistance to ground of the downlead, a resistance to ground of the grounding body, a total resistance of the grounding system path, or the like. By determining whether the resistance parameter exceeds a standard-specified limiting value, whether there may be loose, broken, rusted, poorly grounded and other faults in the grounding system path can be determined, therefore, the reliability of the grounding system is determined.

Since the measurement of grounding parameters in related art usually adopts manual measurement mode, even if a certain measurement shows that the grounding resistance meets the requirements, as time goes by, the grounding system is completely and likely to have local corrosion fractures, loose overlap joints and oxidation and rust on the contact surface before the next measurement, resulting in missed measurement of the grounding system, so that even qualified measured results cannot guarantee the long-term reliability of the grounding system. Actually, the oxidation corrosion of the contact surface of the overlap joints of the downlead is certain to occur between two measurements. If lightning strike occurs under this case, grounding protection inevitably loses its effectiveness to cause accidents.

Considering the above factors, the measurement system involved in the above method may be ready to use and mount, so that single measurement for the grounding system is realized. Alternatively, the system may further be long-time fixed mounting, so that the grounding system of the grounded apparatus is monitored on line in real time or automatically and periodically monitored.

In an embodiment, under a case that the grounded apparatus has a supporting component and/or an external connection accessory, a grounding path of the grounded apparatus includes three branches. A first branch is the special grounding system path via the down lead, the grounding body to the ground, and a branch resistance of the first branch includes a downlead resistance $R_L$ and a resistance to ground $R_E$ of the grounding body. A second branch is a path directly to the ground via the downlead, and a branch resistance of the second branch includes the downlead resistance $R_L$ and a resistance to ground $R_T$ of the downlead. A third branch is a path via the supporting component or the external connection accessory of the grounded apparatus to the ground, and a branch resistance of the third branch is an equivalent bypass resistance $R_S$. Optionally, the resistance to ground $R_E$ of the grounding body is a resistance from the internal of the grounding body to the ground. The downlead resistance $R_L$ is a resistance of the downlead between the grounded apparatus and the grounding body, which are mainly expressed as a welding resistance and bonding resistance everywhere on the downlead path. A total grounding resistance $R_C$ of the grounded apparatus is a total ground resistance of the grounded apparatus via all possible paths, such as the downlead, the grounding body, a base of the grounded apparatus, a supporting frame and an external connection pipeline, to the ground.

It is to be noted that, according to the grounded apparatus and different actual situations and conditions of its grounding system, the quantity of the branches of the grounding path and the equivalent circuit thereof may be differ from the quantity of the branches shown in FIG. 3 and the equivalent circuit, which are not limited herein.

Optionally, step S602 of inputting the driving current into the plurality of sections of the grounding system path may specifically include inputting the driving current to the plurality of sections by using a driving electrode.

In an optional solution, the above driving electrodes may be a metal conductor, for example, a cold pressed connecting terminal made of brass or red copper.

It is to be noted that, the underground driving electrode may also be a rod metal body having an anti-rust function. One end of the metal body may be in a conical shape, so that the metal body is easily inserted into the ground, and the service life of the electrode is prevented from being affected by soil corrosion.

In the above step, by applying the driving current of which current is known to any section of the grounding system path by using the driving electrode, the magnitude of the driving current is controllable. For example, for safety, the magnitude of the driving current may select a weak driving current that meets an intrinsic safety standard.

In an embodiment, step S604 of measuring the response voltages generated by the plurality of sections may specifically include measuring the response voltages generated by the plurality of sections by using a sensing electrode.

In an optional solution, the above sensing electrode may also be the metal conductor, for example, the cold pressed connecting terminal made of brass or red copper. Likewise, the underground sensing electrode may also be the rod metal body having an anti-rust function. One end of the metal body may be in the conical shape.

In the above step, the driving electrode and the sensing electrode may be disposed in pairs at the plurality of sections of the grounding system path. In this way, if the monitor applies the driving current of which current is known to some section of the grounding system path by using the driving electrode, the response voltage at the section can be measured by the sensing electrode.

It is easily to be noted that, since the driving electrode is configured to apply the current to the grounding system path, and the sensing electrode is configured to measure the voltage of the section applied with the current, the driving electrode and the sensing electrode mounted on the grounding system path are mounted as close as possible, but cannot be in direct contact with each other.

In an embodiment, the driving electrode includes a first driving electrode D2, a second driving electrode D1 and a third driving electrode D0. The sensing electrode includes a first sensing electrode S2, a second sensing electrode S1 and a third sensing electrode S0. The first driving electrode D2 and the first sensing electrode S2 are disposed at the grounded apparatus. The second driving electrode D1 and the second sensing electrode S1 are disposed a preset distance of the grounding system path from the grounding body. The third sensing electrode S0 and the third driving electrode D0 are disposed under the ground and successively disposed on an extended line of a line segment determined by the grounded apparatus and the grounding body. The third sensing electrode S0 is located outside a drift electric field of the third driving electrode D0 and the grounding body.

In an optional solution, the preset distance may be 0, that is, the second driving electrode D1 and the second sensing electrode S1 are disposed on the grounding body. The preset distance may be a distance of a position point on the downlead close to the grounding body from the grounding body, for example, 5 cm, 3 cm, and the like. The line segment is determined based on a top view angle. Further, viewing downward from the top view angle, a center point of the third driving electrode, a center point of the third sensing electrode, a center point of the grounding body and a center point of the grounded apparatus are successively located on a same straight line.

In an embodiment, the first driving electrode D2 and the first sensing electrode S2 are mounted at a main conductive portion applicable for grounding, such as a metal framework and a metal housing, of the grounded apparatus. The second driving electrode D1 and the second sensing electrode S1 are mounted on the grounding body or the downlead close to the grounding body. The first driving electrode D2, the first sensing electrode S2, the second driving electrode D1 and the second sensing electrode S1 may be formed by welding conducting wires on brass/red copper cold pressed connecting terminals. The first driving electrode D2 and the first sensing electrode S2 are tightly mounted at the main conductive portion of the grounded apparatus by using bolts/nuts. The second driving electrode D1 and the second sensing electrode S1 are tightly mounted on the grounding body or the downlead close to the grounding body. It is to be noted that, the first driving electrode D2 and the first sensing electrode S2, and the second driving electrode D1 and the second sensing electrode S1 are mounted as close as possible, but cannot be in direct contact with each other.

According to a position mounting condition of the foregoing third driving electrode and the third sensing electrode, for most soil resistivity situations, the third driving electrode D0 may be mounted under the ground away from the grounded apparatus and about 40 m from the grounding body. The third sensing electrode S0 is mounted under the ground at the middle position of the third driving electrode D0 and the grounding body. The third driving electrode D0 and the third sensing electrode S0 may select copper rod electrodes or other metal rod electrodes with galvanized and other surface anti-rust treatment, and are respectively buried under the ground away from the grounded apparatus and about 40 m and 20 m from the grounding body.

Through the above fixed mounting manner, the monitor may completely and accurately monitor resistance values of the grounding system and the reliability of the system. Therefore, tedious operation of manual measurement, incomplete measurement of the grounding system and untimely detection of faults in the grounding system are overcome, and wrong measurement or missed measurement of the faults such as rust and fracture of the grounding system is avoided.

In an embodiment, step S602 of inputting the driving current into the plurality of sections by using the driving electrode may specifically include the following steps: At step S6021, the first driving electrode D2 and the second driving electrode D1 input a first driving current $I_{D12}$ into a section between the first driving electrode D2 and the second driving electrode D1. At step S6022, the second driving electrode D1 and the third driving electrode D0 input a second driving current $I_{D10}$ into a section between the second driving electrode D1 and the third driving electrode D0. At step S6023, the first driving electrode D2 and the third driving electrode D0 input a third driving current $I_{D20}$ into a section between the first driving electrode D2 and the third driving electrode D0.

In an optional solution, the first driving current, the second driving current and the third driving current may be weak driving currents that meet an intrinsic safety standard and have known magnitudes.

It is to be noted that, since the grounding systems of too many power devices mainly achieve grounding protection for alternating currents, results measured by the related art mostly are alternating current grounding resistances of the grounded apparatus. However, for actual working conditions of lightning protection and electrostatic prevention of the grounding system of the oil tank, the alternating current grounding resistance can neither reflect a direct current grounding resistance during electrostatic discharge, nor reflect an impact earth resistance during lightning discharge. Therefore, there are still some problems with the applicability of the results obtained by a conventional grounding system measurement technology. In addition, a conventional monitor generally generates a high voltage or a large current during measurement. For example, an excitation voltage during measurement is usually as high as forty to fifty volts to one or two hundred volts, and the current may be as high as tens of amperes. In view of a measurement object and site of the grounding system of the oil tank, regardless of the oil in the tank or the high concentration oil and gas that may appear in the reservoir area outside the tank, the appearance of the high voltage or large current is a safety hazard.

Considering the above factors, the driving current in this disclosure may be set according to requirements. Optionally, in addition to a conventional alternating current, a waveform of the driving current may further be a direct current and shock pulse, which can measure a driving current resistance parameter and an impact resistance parameter of the grounding system of the oil tank for the situations of electrostatic discharge and lightning discharge. The driving current may be the weak driving current that meets the intrinsic safety standard, so that the high voltage or large current cannot be generated during measurement. Therefore, good safety performance is achieved.

In an embodiment, step S604 of measuring the response voltages generated by the plurality of sections, and acquiring the response current flowing through the downlead may specifically include the follow steps: At step S6041, the first sensing electrode S2 and the second sensing electrode S1 measure a first response voltage $V_{S12}$ of a section between the first sensing electrode S2 and the second sensing electrode S1, and the a first response current $I_{L12}$ flowing through the downlead is acquired. At step S6042, the second sensing electrode S1 and the third sensing electrode S0 measure a second response voltage $V_{S10}$ of a section between the second sensing electrode S1 and the third sensing electrode S0, and a second response current $I_{L10}$ flowing through the downlead is acquired. At step S6043, the first sensing electrode S2 and the third sensing electrode S0 measure a third response voltage $V_{S20}$ of a section between the first sensing electrode S2 and the third sensing electrode S0, and a third response current $I_{L20}$ flowing through the downlead is acquired.

In an embodiment, step S604 of acquiring the response current flowing through the downlead may include: acquiring the response current on the downlead between the second driving electrode D1/the second sensing electrode S1 and the grounding body; alternatively, acquiring the response current on the downlead between the grounded apparatus and the second driving electrode D1/the second sensing electrode S1.

It is to be noted that, the current sensing apparatus CT is externally sleeved on the downlead close to the grounded apparatus end or close to the grounding body end, and is configured to measure the current flowing through the downlead. If the current sensing apparatus is externally sleeved on the downlead close to the grounding body end, the current sensing apparatus may be located between the second driving electrode D1/the second sensing electrode S1 and the grounding body, and may further be located between the second driving electrode D1/the second sensing electrode S1 and an oil tank.

In an embodiment, step S606 of determining resistance parameters of a to-be-measured grounding system path according to the driving current, the response voltage and the response current may include the following steps: At step S6061, a first relationship model among the first driving current $I_{D12}$, the first response voltage $V_{S12}$ and the first response current $I_{L12}$ is acquired based on circuit principles such as the Ohm law and the Kirchhoff law. At step S6062, a second relationship model among the second driving current $I_{D10}$, the second response voltage $V_{S10}$ and the second response current $I_{L10}$ is acquired based on circuit principles such as the Ohm law and the Kirchhoff law. At step S6063, a third relationship model among the third driving current $I_{D20}$, the third response voltage $V_{S20}$ and the third response current $I_{L20}$ is acquired based on circuit principles such as the Ohm law and the Kirchhoff law. At step S6064, the resistance parameters of the to-be-measured grounding system path are determined according to the first relationship model, the second relationship model and the third relationship model.

Referring to FIG. 3 and FIG. 4, according to a series-parallel relationship of each grounding branch resistance of the grounded apparatus, and through the utilization of the Ohm law, the Kirchhoff voltage law and the Kirchhoff current law, the following equation set is listed:

$$\begin{cases} V_{S10} = I_{L10} \cdot R_E \\ I_{D10} = I_{L10} + \dfrac{V_{S10}}{R_T} + \dfrac{V_{S10}}{R_L + R_S} \\ V_{S20} = I_{L20} \cdot R_E + \left(I_{L20} + \dfrac{I_{L20} \cdot R_E}{R_T}\right) \cdot R_L \\ I_{D20} = \dfrac{V_{S20}}{R_C} = \dfrac{V_{S20}}{R_S} + \dfrac{V_{S20}}{R_L + R_E \| R_T} \\ V_{S12} = I_{L12} \cdot R_E + \left(I_{L12} + \dfrac{I_{L12} \cdot R_E}{R_T}\right) \cdot R_S \\ I_{D12} = \dfrac{V_{S12}}{R_L} + I_{L12} + \dfrac{I_{L12} \cdot R_E}{R_T} \end{cases}$$

By solving the above equation set, key resistance parameters of the grounding system path, such as the total grounding resistance $R_C$ of the grounded apparatus, the downlead resistance $R_L$ and the resistance to ground $R_E$ of the grounding body, can be obtained. As shown in FIG. 5, if the current sensing apparatus is externally sleeved on the downlead of the grounded apparatus side tightly close to the second driving electrode D1 and the second sensing electrode S1, or externally sleeved on the downlead tightly close to the grounded apparatus end, a solving process is similar to the above method, and is not described herein again.

Through the description of the above implementations, those skilled in the art may clearly understand that the method according to the above embodiments can be implemented by means of software and a necessary general hardware platform, definitely, it can also be implemented by means of hardware, but in many cases, the former is a better implementation. Based on such understanding, the technical solution of this disclosure can be embodied in the form of a software product in essence or the part that contributes to the related art. The computer software product is stored in a storage medium (for example, a microcontroller chip including an on-chip memory, an ROM/RAM storage chip, a magnetic disk, or an optical disk), and includes a plurality of instructions, to cause a terminal device (may be a single chip microcomputer, an embedded microprocessor, a mobile phone, a computer, a server, a network device, or the like) to perform the method described in the embodiments of this disclosure.

Figure 7:
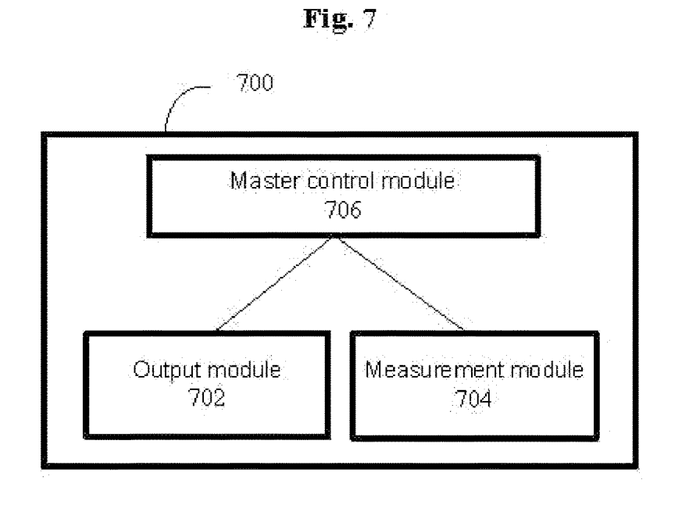
FIG. 7 is a schematic structural diagram of modules of an optional apparatus for measuring a resistance parameter of a grounding system according to an embodiment of the present disclosure.

According to an embodiment of this disclosure, an apparatus for measuring a resistance parameter of a grounding system is provided. FIG. 7 is a schematic structural diagram of modules of an optional apparatus for measuring a resistance parameter of a grounding system according to an embodiment of this disclosure. As shown in FIG. 7, the apparatus 700 includes an output module 702, a measurement module 704 and a master control module 706.

The output module 702 is configured to output a driving current to a plurality of sections of a grounding system path. The grounding system path includes at least a grounded apparatus, a grounding body, and a downlead connecting the grounded apparatus and the grounding body. The measurement module 704 is configured to measure response voltages generated by the plurality of sections, and acquire a response current flowing through the downlead. The master control module 706 is configured to determine a resistance parameter of the grounding system path according to the driving current, the response voltages and the response current.

It is to be noted herein that, the above output module 702, the measurement module 704 and the master control module 706 may be used as a part of the apparatus to be operated in a terminal. Functions implemented by the above modules may be performed by a processor in the terminal. The terminal may further be an embedded computer, a smart phone (for example, an Android phone, an iOS phone, or the like), a tablet computer, a handheld computer, a mobile internet device (MID), PAD, and other terminal devices.

In an embodiment, under a case that the grounded apparatus has a supporting component and an external connection accessory, a grounding path of the grounded apparatus includes three branches. A first branch is a path via the downlead, the grounding body to the ground, and a branch resistance of the first branch includes a downlead resistance and a resistance to ground of the grounding body. A second branch is a path via the downlead to the ground, and a branch resistance of the second branch includes the downlead resistance and the resistance to ground of the downlead. A third branch is a path via the supporting component and the external connection accessory of the grounded apparatus to the ground, and a branch resistance of the third branch is an equivalent bypass resistance.

In an embodiment, the output module includes an output submodule. The output submodule is configured to output the driving current to the plurality of sections by using the driving electrode.

It is to be noted herein that, the output submodule may be used at a part of the apparatus to be operated in the terminal. A function of the above unit may be performed by the processor in the terminal.

In an embodiment, the measurement module includes: a voltage measurement submodule, configured to measure the response voltages generated by the plurality of sections by using a sensing electrode; and a current acquisition submodule, configured to acquire the corresponding response current flowing through the downlead by reading an output signal of a current sensing apparatus.

It is to be noted herein that, the voltage measurement submodule and the current acquisition submodule may be used at a part of the apparatus to be operated in the terminal. Functions of the above units may be performed by the processor in the terminal.

In an embodiment, the driving electrode includes a first driving electrode, a second driving electrode and a third driving electrode. The sensing electrode includes a first sensing electrode, a second sensing electrode and a third sensing electrode. The first driving electrode and the first sensing electrode are disposed at conductive portions of the grounded apparatus. The second driving electrode and the second sensing electrode are disposed a preset distance of the grounding system path from the grounding body. The third sensing electrode and the third driving electrode are disposed under the ground and successively disposed on an extended line of a line segment determined by the grounded apparatus and the grounding body. The third sensing electrode is located outside a drift electric field of the third driving electrode and the grounding body.

In an embodiment, the output submodule includes: a first output submodule, configured to output a first driving current to a section between the first driving electrode and the second driving electrode by using the first driving electrode and the second driving electrode; a second output submodule, configured to output a second driving current to a section between the second driving electrode and the third driving electrode by using second driving electrode and the third driving electrode; a third output submodule, configured to output a third driving current to a section between the first driving electrode and the third driving electrode by using the first driving electrode and the third driving electrode.

It is to be noted herein that, the first output submodule, the second output submodule and the third output submodule may be used at a part of the apparatus to be operated in the terminal. Functions of the above units may be performed by the processor in the terminal.

In an embodiment, the output module may also include only one output submodule. The output submodule is configured to successively generate the first driving current, the second driving current and the third driving current under the control of the master control module. The master control module controls a switch to successively switch the three driving currents outputted by the output submodule onto the first driving electrode and the second driving electrode, onto the second driving electrode and the third driving electrode, and onto the first driving electrode and the third driving electrode. Therefore, the corresponding driving currents are outputted to the corresponding sections.

In an embodiment, the measurement module includes three voltage measurement submodules. A first voltage measurement submodule is configured to measure a first response voltage of a section between the first sensing electrode and the second sensing electrode by using the first sensing electrode and the second sensing electrode. A second voltage measurement submodule is configured to measure a second response voltage of a section between the second sensing electrode and the third sensing electrode by using the second sensing electrode and the third sensing electrode. A third voltage measurement submodule is configured to measure a third response voltage of a section between the first sensing electrode and the third sensing electrode by using the first sensing electrode and the third sensing electrode.

It is to be noted herein that, the first voltage measurement submodule, the second voltage measurement submodule and the third voltage measurement submodule may be used at a part of the apparatus to be operated in the terminal. Functions of the above units may be performed by the processor in the terminal.

In an embodiment, the measurement module may also include only one voltage measurement submodule. The voltage measurement submodule is configured to successively measure the first response voltage of the section between the first sensing electrode and the second sensing electrode, the second response voltage of the section between the second sensing electrode and the third sensing electrode and the third response voltage of the section between the first sensing electrode and the third sensing electrode. The three response voltages are controlled by the master control module to switch the switches to be successively accessed to the voltage measurement submodule.

In an embodiment, the measurement module includes the current acquisition submodule. The current acquisition submodule is configured to acquire a first response current flowing through the downlead when the output module outputs the first driving current, a second response current flowing through the downlead when the output module outputs the second driving current, and a third response current flowing through the downlead when the output module outputs the third driving current. The current acquisition submodule acquires a response current on the downlead by means of a current acquisition input port, may acquire the current on the downlead between the second driving electrode/the second sensing electrode and the grounding body, or acquire the response current on the downlead between the grounded apparatus and the second driving electrode/the second sensing electrode.

It is to be noted herein that, the current acquisition submodule may be used at a part of the apparatus to be operated in the terminal. A function of the above unit may be performed by the processor in the terminal.

In an embodiment, the master control module includes the following software submodules. A first relationship model submodule is configured to acquire a first relationship model among the first driving current, the first response voltage and the first response current based on circuit principles such as an Ohm law and a Kirchhoff law. A second relationship model submodule is configured to acquire a second relationship model among the second driving current, the second response voltage and the second response current based on circuit principles such as the Ohm law and the Kirchhoff law. A third relationship model submodule is configured to acquire a third relationship model among the third driving current, the third response voltage and the third response current based on circuit principles such as the Ohm law and the Kirchhoff law. A grounding system reliability determination submodule is configured to determine resistance parameters of the grounding system according to the first relationship model, the second relationship model and the third relationship model.

It is to be noted herein that, the first relationship model submodule, the second relationship model submodule, the third relationship model submodule and the grounding system reliability determination submodule may be used at a part of the apparatus to be operated in the terminal. Functions of the above units may be performed by the processor in the terminal.

It is to be noted herein that, the above output module 702, the measurement module 704 and the master control module 706 correspond to step S602 to step S606 in the embodiments of this disclosure, examples and disclosure scenarios implemented by the above three modules and the corresponding steps are the same, which are not limited to the contents disclosed in above embodiments. It is to be noted that, the above modules are used as a part of the apparatus, and may be operated in the system for measuring the reliability of a grounding system provided in the embodiments of this disclosure.

In an optional solution, an embodiment of this disclosure provides a non-volatile storage medium. The non-volatile storage medium includes a stored program. The program controls a device where the non-volatile storage medium is located to perform the method for measuring a resistance parameter of a grounding system in this embodiment when being operated by a processor.

The non-volatile storage medium is located in a monitor (or to say it is located in an apparatus for measuring a resistance parameter of a grounding system). The non-volatile storage medium may be an on-chip memory unit or an off-chip memory chip of an internal microprocessor (or known as a microcontroller, a single chip microcomputer or the like). The non-volatile storage medium stores a measurement program/a software code. When the processor operates the code, the method for measuring a resistance parameter of a grounding system in this embodiment of this disclosure may be performed.

In an embodiment, the above measurement program/software includes a program code implementing the following steps when being performed by the processor.

A driving current is inputted into a plurality of sections of a grounding system path. The grounding system path includes at least a grounded apparatus, a grounding body, and a downlead connecting the grounded apparatus and the grounding body.

Response voltages generated by the plurality of sections are measured, and a response current flowing through the downlead is acquired.

A resistance parameter of the grounding system path is determined according to the driving current, the response voltages and the response current.

In an embodiment, the above measurement program/software further includes a program code implementing the following steps when being performed by the processor. The driving current is inputted into the plurality of sections by using a driving electrode.

In an embodiment, the above measurement program/software further includes a program code implementing the following steps when being performed by the processor. The response voltages generated by the plurality of sections are measured by using a sensing electrode.

In an embodiment, the above measurement program/software further includes a program code implementing the following steps when being performed by the processor. A first driving current is inputted to a section between the first driving electrode and the second driving electrode by using the first driving electrode and the second driving electrode. A second driving current is inputted to a section between the second driving electrode and the third driving electrode by using second driving electrode and the third driving electrode. A third driving current is inputted to a section between the first driving electrode and the third driving electrode by using the first driving electrode and the third driving electrode.

In an embodiment, the above measurement program/software further includes a program code implementing the following steps when being performed by the processor. A first response voltage of a section between the first sensing electrode and the second sensing electrode is measured by using the first sensing electrode and the second sensing electrode, and a first response current flowing through the downlead is simultaneously acquired. A second response voltage of a section between the second sensing electrode and the third sensing electrode is measured by using the second sensing electrode and the third sensing electrode, and a second response current flowing through the downlead is simultaneously acquired. A third response voltage of a section between the first sensing electrode and the third sensing electrode is measured by using the first sensing electrode and the third sensing electrode, and a third response current flowing through the downlead is simultaneously acquired.

In an embodiment, the above measurement program/software further includes a program code implementing the following steps when being performed by the processor. The response current of the rear end downlead between the second driving electrode and the grounding body is collected. or, the response current of the front end downlead between the grounded apparatus and the second driving electrode is collected.

In an embodiment, the above measurement program/software further includes a program code implementing the following steps when being performed by the processor. A first relationship model among the first driving current, the first response voltage and the first response current is acquired based on circuit principles such as an Ohm law and a Kirchhoff law. A second relationship model among the second driving current, the second response voltage and the second response current is acquired based on circuit principles such as the Ohm law and the Kirchhoff law. A third relationship model among the third driving current, the third response voltage and the third response current is acquired based on circuit principles such as the Ohm law and the Kirchhoff law. Resistance parameters of the grounding system are determined according to the first relationship model, the second relationship model and the third relationship model.

In an embodiment, for specific examples in this embodiment, reference may be made to the examples described in the foregoing embodiments, and this embodiment will not be repeated here.

In another optional solution of this disclosure, an embodiment of this disclosure further provides another non-volatile storage medium. The non-volatile storage medium is located in a monitoring network host, for example, located in a hard disk, a solid state disk, a compact disk and the like in the monitoring network host. The non-volatile storage medium stores a centralized monitoring program/software. When the monitoring network host performs the centralized monitoring program/software, the functions of sending the set parameters and monitoring instructions to a monitor, receiving a resistance parameter from the monitor, and processing, displaying, recording and storing the received data are completed.

Figure 8:
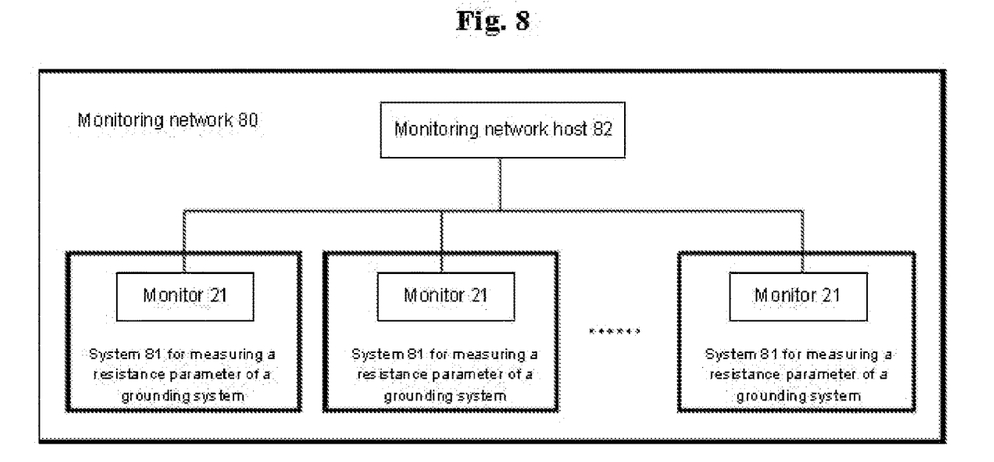
FIG. 8 is a schematic diagram of a monitoring network according to an embodiment of the present disclosure.

According to an embodiment of this disclosure, a monitoring network is provided. FIG. 8 is a schematic diagram of a monitoring network according to an embodiment of this disclosure. As shown in FIG. 8, the monitoring network 80 may include:

at least one system 81 for measuring a resistance parameter of a grounding system provided in the embodiments of this disclosure. The system 81 for measuring a resistance parameter of a grounding system includes a monitor 21.

The monitoring network further includes a monitoring network host 82. The monitoring network host is connected to the monitor 21 in each measurement system 81 in a wired communication or wireless communication manner, is configured to send a set parameter and a monitoring instruction to the monitor 21, receives a resistance parameter of the grounding system from the monitor 21, and analyses overall reliability information.

The monitoring network provided in this embodiment includes at least one system for measuring a resistance parameter of a grounding system. Each measurement system communicates with the monitoring network host in a wired or wireless manner. In this way, distributed monitoring is performed on a plurality of grounded apparatuses or a plurality of grounding system paths, and a purpose of centralized monitoring is achieved.

The serial numbers of the foregoing embodiments of this disclosure are merely for description, and do not represent the superiority or inferiority of the embodiments.

In the above embodiments of this disclosure, the description of the embodiments has its own focus. For parts that are not described in detail in a certain embodiment, reference may be made to related descriptions of other embodiments.

In the several embodiments provided in this disclosure, it should be understood that, the disclosed technical content can be implemented in other ways. The apparatus embodiments described above are merely illustrative. For example, the division of the units may be a logical function division, and there may be other divisions in actual implementation. For example, a plurality of units or components may be combined or integrated into another system, or some features can be ignored, or not implemented. In addition, the displayed or discussed mutual coupling or direct coupling or communication connection may be indirect coupling or communication connection through some interfaces, units or modules, and may be in electrical or other forms.

The units described as separate components may or may not be physically separated. The components displayed as units may or may not be physical units, that is, the components may be located in one place, or may be distributed on the plurality of units. Part or all of the units may be selected according to actual requirements to achieve the purposes of the solutions of this embodiment.

In addition, the functional units in the various embodiments of this disclosure may be integrated into one processing unit, or each unit may exist alone physically, or two or more than two units may be integrated into one unit. The above integrated unit can be implemented in the form of hardware, or can be implemented in the form of a software functional unit.

If the integrated unit is implemented in the form of the software functional unit and sold or used as an independent product, it can be stored in the non-volatile storage medium. Based on such understanding, the technical solution of this disclosure essentially or the part that contributes to the related art or all or part of the technical solution can be embodied in the form of a software product. The computer software product is stored in the non-volatile storage medium. The non-volatile storage medium may be located in a monitor (or to say it is located in an apparatus for measuring a resistance parameter of a grounding system). The non-volatile storage medium may be an on-chip memory unit or an off-chip memory chip of an internal microprocessor (or known as a microcontroller, a single chip microcomputer or the like). The non-volatile storage medium stores a measurement program/a software code. When the processor operates the code, the method for measuring a resistance parameter of a grounding system in this embodiment of this disclosure is performed. Optionally, the computer software product is further stored in another non-volatile storage medium located in a monitoring network host. For example, the non-volatile storage medium is located in a hard disk, a solid state disk, a compact disk and the like in the monitoring network host. The non-volatile storage medium stores a centralized monitoring program/software. When the monitoring network host performs the centralized monitoring program/software, the functions of sending the set parameters and monitoring instructions to a monitor, and receiving a resistance parameter from the monitor, and processing, displaying, recording and storing received data are completed. The foregoing non-volatile storage medium includes an embedded processor and an on-chip memory of a microcontroller, a USB flash disk, a read-only memory (ROM), a random access memory (RAM), and various media that can store program codes, such as a mobile hard disk, a magnetic disk, or an optical disk.

The above description is merely preferred implementations of this disclosure, and it should be noted that persons of ordinary skill in the art may also make several improvements and refinements without departing from the principle of this disclosure, and it should not be considered that these improvements and refinements shall fall within the protection scope of this disclosure.

INDUSTRIAL APPLICABILITY

The solution provided in the embodiments of this disclosure is applicable to a process for measuring a resistance parameter of a grounding system. A driving current is inputted into a plurality of sections of a grounding system path. The grounding system path includes at least a grounded apparatus, a grounding body, and a downlead connecting the grounded apparatus and the grounding body. Response voltages generated by the plurality of sections are measured, and a response current flowing through the downlead is acquired. A resistance parameter of the grounding system path is determined according to the driving current, the response voltages and the response current. Through the above solution, the driving current is applied to the plurality of sections, to measure the corresponding response voltages and the response current. Based on a circuit principle such as an Ohm law and a Kirchhoff law, an association relationship of the above parameters is established. Therefore, a purpose of accurately acquiring the grounding resistance of the grounded apparatus, the resistance parameters of the grounding system path and overall reliability information is achieved. In this way, the technical problem of easy missed measurement and wrong measurement of fault in the grounding system due to only local measurement performed on the grounding system in the related art is resolved.

What is claimed is:

1. A method for measuring a resistance parameter of a grounding system, comprising:
    inputting a driving current into a plurality of sections of a grounding system path by using a driving electrode, wherein the grounding system path comprises at least a grounded apparatus, a grounding body, and a downlead connecting the grounded apparatus and the grounding body;
    measuring response voltages generated by the plurality of sections by using a sensing electrode, and acquiring a response current flowing through the downlead; and
    determining a resistance parameter of the grounding system path according to the driving current, the response voltages and the response current;
    wherein the driving electrode comprises at least a first driving electrode, a second driving electrode and a third driving electrode, and the sensing electrode comprises at least a first sensing electrode, a second sensing electrode and a third sensing electrode, wherein
    the first driving electrode and the first sensing electrode are disposed at a conductive portion of the grounded apparatus;
    the second driving electrode and the second sensing electrode are disposed at a preset distance of the grounding system path from the grounding body; and
    the third sensing electrode and the third driving electrode are disposed under the ground and successively disposed on an extended line of a line segment pointing from the grounded apparatus to the grounding body, wherein the third sensing electrode is located outside a drift electric field of the third driving electrode and the grounding body.

2. The method according to claim 1, wherein a grounding path of the grounded apparatus comprises three branches: a first branch is the grounding system path via the downlead, the grounding body to the ground, and a branch resistance of the first branch comprises a downlead resistance and a resistance to ground of the grounding body; a second branch is a path via the downlead to the ground, and a branch resistance of the second branch comprises the downlead resistance and the resistance to ground of the grounding body; and a third branch is a path via a supporting component and/or an external connection accessory of the grounded apparatus to the ground, and a branch resistance of the third branch is equivalent to a bypass resistance.

3. The method according to claim 1, wherein the step of inputting a driving current into a plurality of sections by using a driving electrode comprises:
    inputting a first driving current into a section between the first driving electrode and the second driving electrode by using the first driving electrode and the second driving electrode;
    inputting a second driving current into a section between the second driving electrode and the third driving electrode by using the second driving electrode and the third driving electrode; and
    inputting a third driving current into a section between the first driving electrode and the third driving electrode by using the first driving electrode and the third driving electrode.

4. The method according to claim 3, wherein the step of measuring response voltages generated by the plurality of sections by using a sensing electrode and acquiring a response current flowing through the downlead comprises:
    measuring a first response voltage of a section between the first sensing electrode and the second sensing electrode by using the first sensing electrode and the second sensing electrode, and simultaneously acquiring a first response current flowing through the downlead;
    measuring a second response voltage of a section between the second sensing electrode and the third sensing electrode by using the second sensing electrode and the third sensing electrode, and simultaneously acquiring a second response current flowing through the downlead; and
    measuring a third response voltage of a section between the first sensing electrode and the third sensing electrode by using the first sensing electrode and the third sensing electrode, and simultaneously acquiring a third response current flowing through the downlead.

5. The method according to claim 1, wherein the step of acquiring a response current flowing through the downlead comprises:
    acquiring a response current of a rear end downlead between the second driving electrode and the grounding body; alternatively
    acquiring a response current of a front end downlead between the grounded apparatus and the second driving electrode.

6. The method according to claim 4, wherein the step of determining a resistance parameter of the grounding system path according to the driving current, the response voltages and the response current comprises:
    based on an Ohm law and a Kirchhoff law, acquiring a first relationship model among the first driving current, the first response voltage and the first response current;
    based on the Ohm law and the Kirchhoff law, acquiring a second relationship model among the second driving current, the second response voltage and the second response current;
    based on the Ohm law and the Kirchhoff law, acquiring a third relationship model among the third driving current, the third response voltage and the third response current; and
    determining the resistance parameter of the grounding system path according to the first relationship model, the second relationship model and the third relationship model.

7. A non-transitory storage medium, comprising a stored program, wherein when the program being performed by a processor, the program controls a device where the non-transitory storage medium is located to perform the method for measuring a resistance parameter of a grounding system as claimed in claim 1.

8. A non-transitory storage medium, comprising a stored program, wherein when the program being performed by a processor, the program controls a device where the non-transitory storage medium is located to perform the method for measuring a resistance parameter of a grounding system as claimed in claim 2.

9. A non-transitory storage medium, comprising a stored program, wherein when the program being performed by a processor, the program controls a device where the non-transitory storage medium is located to perform the method for measuring a resistance parameter of a grounding system as claimed in claim 3.

10. A non-transitory storage medium, comprising a stored program, wherein when the program being performed by a processor, the program controls a device where the non-transitory storage medium is located to perform the method for measuring a resistance parameter of a grounding system as claimed in claim 4.

11. A non-transitory storage medium, comprising a stored program, wherein when the program being performed by a processor, the program controls a device where the non-transitory storage medium is located to perform the method for measuring a resistance parameter of a grounding system as claimed in claim 6.

12. A non-transitory storage medium, comprising a stored program, wherein when the program being performed by a processor, the program controls a device where the non-transitory storage medium is located to perform the method for measuring a resistance parameter of a grounding system as claimed in claim 5.

13. A system for measuring a resistance parameter of a grounding system, comprising:
a plurality of driving electrodes, connected to a current output end of a monitor, disposed at a plurality of sections of a grounding system path, and configured to input a driving current into the plurality of sections, wherein the grounding system path comprises at least a grounded apparatus, a grounding body, and a downlead connecting the grounded apparatus and the grounding body;
a plurality of sensing electrodes, connected to a voltage input end of the monitor, wherein the plurality of sensing electrodes and the plurality of driving electrodes are disposed at the plurality of sections in pairs, and the sensing electrodes are configured to measure response voltages generated by the plurality of sections;
a current sensing apparatus, connected to a current acquisition input end of the monitor, sleeved on the downlead, and configured to sense a response current flowing through the downlead; and
the monitor, configured to determine a resistance parameter of the grounding system path according to the driving current, the response voltages and the response current;
wherein the driving electrode comprises at least a first driving electrode, a second driving electrode and a third driving electrode, and the sensing electrode comprises at least a first sensing electrode, a second sensing electrode and a third sensing electrode, wherein
the first driving electrode and the first sensing electrode are disposed at a conductive portion of the grounded apparatus;
the second driving electrode and the second sensing electrode are disposed at a preset distance of the grounding system path from the grounding body; and
the third sensing electrode and the third driving electrode are disposed under the ground and successively disposed on an extended line of a line segment pointing from the grounded apparatus to the grounding body, wherein the third sensing electrode is located outside a drift electric field of the third driving electrode and the grounding body.

14. The system according to claim 13, wherein the monitor comprises a wired communication module and/or a wireless communication module.

15. A monitoring network, comprising:
at least a system for measuring a resistance parameter of a grounding system as claimed in claim 14; and
a monitoring network host, connected to a monitor in a wired communication or wireless communication manner, configured to send a set parameter and a monitoring instruction to the monitor, and receiving a resistance parameter from the monitor.

16. A monitoring network, comprising:
at least a system for measuring a resistance parameter of a grounding system as claimed in claim 13; and
a monitoring network host, connected to a monitor in a wired communication or wireless communication manner, configured to send a set parameter and a monitoring instruction to the monitor, and receiving a resistance parameter from the monitor.

17. An apparatus for measuring a resistance parameter of a grounding system, comprising:
an output module, configured to output a driving current to a plurality of sections of a grounding system path by using a driving electrode, wherein the grounding system path comprises at least a grounded apparatus, a grounding body, and a downlead connecting the grounded apparatus and the grounding body;
a measurement module, configured to measure response voltages generated by the plurality of sections by using a sensing electrode, and acquire a response current flowing through the downlead; and
a master control module, configured to determine a resistance parameter of the grounding system path according to the driving current, the response voltages and the response current, wherein
the driving electrode comprises at least a first driving electrode, a second driving electrode and a third driving electrode, and the sensing electrode comprises at least a first sensing electrode, a second sensing electrode and a third sensing electrode, wherein
the first driving electrode and the first sensing electrode are disposed at a conductive portion of the grounded apparatus;
the second driving electrode and the second sensing electrode are disposed at a preset distance of the grounding system path from the grounding body; and
the third sensing electrode and the third driving electrode are disposed under the ground and successively disposed on an extended line of a line segment pointing from the grounded apparatus to the grounding body, wherein the third sensing electrode is located outside a drift electric field of the third driving electrode and the grounding body.

* * * * *